United States Patent
Cho et al.

(10) Patent No.: US 12,069,904 B2
(45) Date of Patent: Aug. 20, 2024

(54) LIGHT EMITTING DIODE DISPLAY APPARATUS

(71) Applicant: LG DISPLAY CO., LTD., Seoul (KR)

(72) Inventors: Beum-Sik Cho, Paju-si (KR); Ji-Yoon Shin, Paju-si (KR); Tae-Keun Lee, Paju-si (KR); Jung-Chul Kim, Paju-si (KR); Jun-Ho Yeo, Paju-si (KR); Mi-So Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 366 days.

(21) Appl. No.: 17/559,822

(22) Filed: Dec. 22, 2021

(65) Prior Publication Data

US 2022/0208918 A1  Jun. 30, 2022

(30) Foreign Application Priority Data

Dec. 30, 2020 (KR) .................. 10-2020-0187273
Oct. 7, 2021 (KR) .................. 10-2021-0133055

(51) Int. Cl.
*H10K 59/123* (2023.01)
*H10K 59/121* (2023.01)
*H01L 27/12* (2006.01)

(52) U.S. Cl.
CPC ....... *H10K 59/123* (2023.02); *H10K 59/1213* (2023.02); *H01L 27/124* (2013.01)

(58) Field of Classification Search
CPC .................. H10K 59/123; H10K 59/1213
See application file for complete search history.

(56) References Cited

U.S. PATENT DOCUMENTS

| 10,147,777 | B2 * | 12/2018 | Lim | ........ H10K 59/123 |
| 2011/0248968 | A1 * | 10/2011 | Suh | ........ H10K 59/131 345/204 |
| 2017/0092698 | A1 * | 3/2017 | Zou | ........ H10K 59/123 |
| 2019/0035872 | A1 * | 1/2019 | Um | ........ H10K 59/123 |
| 2020/0185467 | A1 * | 6/2020 | Sun | ........ H10K 59/1213 |

FOREIGN PATENT DOCUMENTS

| KR | 10-0786877 B1 | 12/2007 |
| KR | 10-2016-0032742 A | 3/2016 |

* cited by examiner

*Primary Examiner* — Peter M Albrecht
(74) *Attorney, Agent, or Firm* — POLSINELLI PC

(57) ABSTRACT

A light emitting diode display apparatus includes: a substrate; a driving element region which is formed on the substrate and in which a plurality of driving elements are arranged in a matrix form; and an emitting element region in which a plurality of emitting elements are arranged in a matrix form, wherein the emitting element includes a first electrode which corresponds to each driving element and is electrically connected to each driving element, a second electrode corresponding to the first electrode, and an emitting layer located between the first electrode and the second electrode, wherein an area of the emitting element region is greater than an area of the driving element region.

30 Claims, 9 Drawing Sheets

LIGHT EMITTING DIODE DISPLAY APPARATUS

CROSS-REFERENCE TO RELATED APPLICATION

The present application claims the priority of Korean Patent Application Nos. 10-2020-0187273 and 10-2021-0133055 respectively filed on Dec. 30, 2020 and Oct. 7, 2021, which are hereby incorporated by reference in their entirety.

BACKGROUND

Field of the Disclosure

The present disclosure relates to a light emitting diode display apparatus, and particularly, relates to a light emitting diode display apparatus with a light emitting element located at an edge region in order to realize a narrow bezel.

Description of the Background

Among display apparatuses, an electroluminescent display apparatus is a self-luminescent type display apparatus and has advantages of light weight and thin profile because of requiring no backlight and of being operated with a low power. Particularly, among electroluminescent display apparatuses, an organic light emitting diode display apparatus has advantages of being operated with a DC low voltage, fast response speed and low production cost.

An electroluminescent display apparatus includes a plurality of electroluminescent elements. Each electroluminescent element is configured with a diode type light emitting element. The light emitting element includes an anode, a cathode and a light emitting layer therebetween. When the anode is applied with a high potential voltage and the cathode is applied with a low potential voltage, holes from the anode and electrons from the cathode moves to the light emitting layer. The electron and the hole are combined at the light emitting layer and form an exciton, and a light energy are produced from the exciton.

The electroluminescent display apparatus includes a display region to display an image and a non-display region surrounding the display region. Particularly, signal lines to supply signals to light emitting elements located at the display region are located at the non-display region and take up some area.

However, needs for a full screen display apparatus with a display region of an overwhelmingly large proportion out of display apparatuses increases nowadays. However, in order to realize a full screen, reducing a bezel region, in which signal lines are located, out of the non-display region is necessary. Further, for a display apparatus of a GIP (gate in panel) structure, in which a gate driving circuit portion generating gate driving signals is formed at the non-display region, attempts to reduce a bezel is continued.

SUMMARY

Accordingly, the present disclosure is directed to a light emitting diode display apparatus that substantially obviates one or more of the problems due to limitations and disadvantages described above.

More specifically, the present disclosure is to provide a light emitting diode display apparatus which can locate a light emitting element in a non-display region of a related art thus reduce a ratio of a non-display region and thus realize a narrow bezel.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the present disclosure, as embodied and broadly described herein, a light emitting diode display apparatus includes: a substrate; a driving element region which is formed on the substrate and in which a plurality of driving elements are arranged in a matrix form; and an emitting element region in which a plurality of emitting elements are arranged in a matrix form, wherein the emitting element includes a first electrode which corresponds to each driving element and is electrically connected to each driving element, a second electrode corresponding to the first electrode, and an emitting layer located between the first electrode and the second electrode, wherein an area of the emitting element region is greater than an area of the driving element region.

In another aspect, a light emitting diode display apparatus includes: a substrate including a driving element region, in which a plurality of driving elements are arranged in a matrix form, and a peripheral region surrounding the driving element region, wherein a plurality of emitting elements are arranged in a matrix form in an emitting element region, wherein the emitting element includes a first electrode which corresponds to each driving element and is electrically connected to each driving element, a second electrode corresponding to the first electrode, and an emitting layer located between the first electrode and the second electrode, and wherein the emitting element region overlaps the driving element region and the peripheral region.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the present disclosure, illustrate aspects of the disclosure and together with the description serve to explain the principles of the disclosure.

In the drawings.

DETAILED DESCRIPTION

Figure 1:
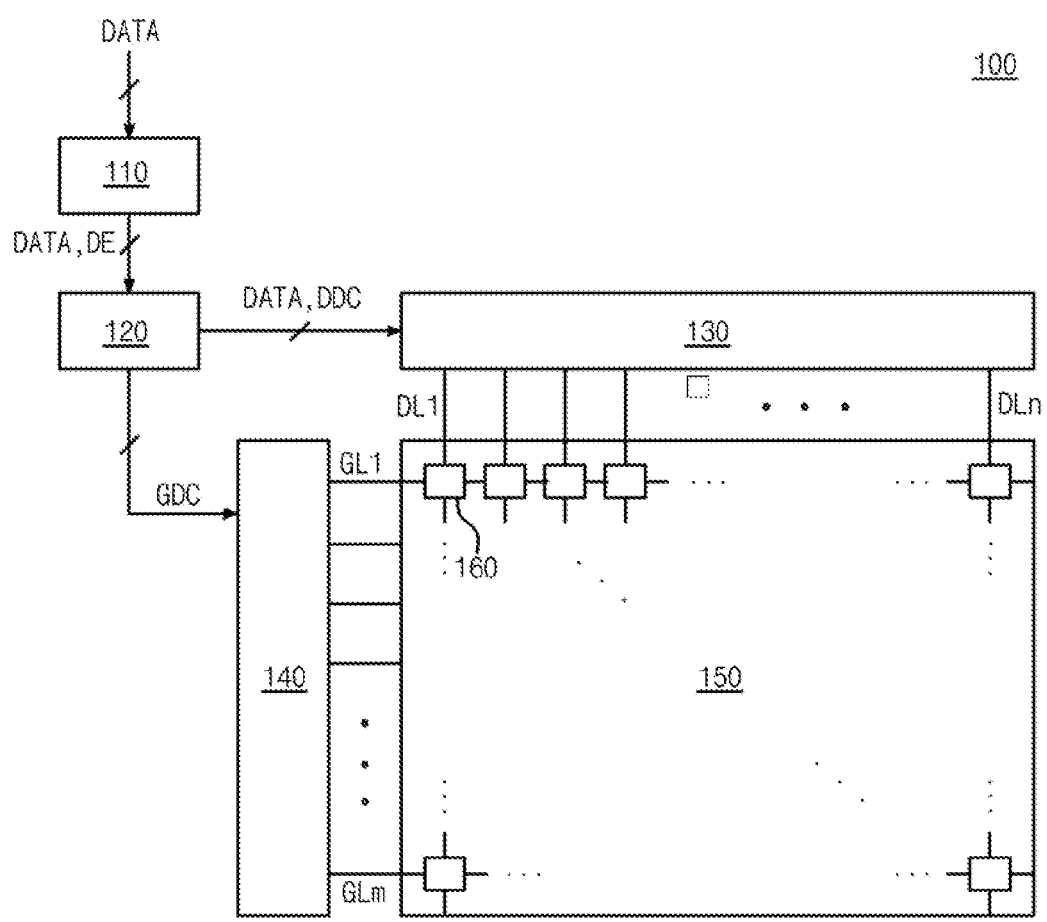
FIG. 1 is a block diagram illustrating an electroluminescent display apparatus according to an aspect of the present disclosure.

Reference will now be made in detail to exemplary aspects, examples of which are illustrated in the accompanying drawings. The same reference numbers may be used throughout the drawings to refer to the same or like parts.

A shape, a size, a ratio, an angle, a number shown in the drawings to explain examples of the present disclosure are exemplary and the present disclosure are not limited to matters shown in the drawings. In the description, detailed explanations of relevant prior art are omitted provided it may cloud a gist of the present disclosure.

In case that "include", "have", "composed of" or the like is used in the present disclosure, other part may be added unless "only" is used. In case that a component is expressed in the singular, the component being plural is covered unless other explicit statement is specially made.

In interpreting components, it is interpreted that an error range is covered even though an explicit statement is made separately.

In explanation of position relation, for example, in explanation of position relation of two parts with "on", "over", "below", "aside" or the like, at least one other part may be located between the two parts unless "right" or "directly" are used.

In explanation of time relation, for example, in explanation of time sequence with "after", "following", "next", "before" or the like, a case of not continuing may be covered unless "right" or "directly" are used.

A first, a second and the like is used to describe various components, but the components are not limited by the terms. The terms are used only to distinguish one component from other component. Thus, a first component mentioned below may be a second component within a technical idea of the present disclosure.

A term "at least one" should be understood to include all possible combinations to suggested from one or more relevant items. For example, "at least one of a first item, a second item and a third item" may mean each of a first item, a second item and a third item and all combinations to be suggested from two or more of a first item, a second item and a third item.

Individual features of various examples of the present disclosure may be partially or entirely coupled or combined with each other and may have technically various inter-operation and driving, and the examples may be embodied individually or embodied together with interrelation.

FIG. 1 is a block diagram illustrating a light emitting diode display apparatus, and particularly, an electroluminescent display apparatus according to an aspect of the present disclosure.

Referring to FIG. 1, the electroluminescent display apparatus 100 may include an image processing portion 110, a timing controller 120, a data driver 130, a gate driver 140 and a display region 150.

The image processing portion 110 may output a data signal DATA and a data enable signal DE which are supplied from an outside. The image processing portion 110 may output the data enable signal DE, and furthermore, at least one of a vertical synchronization signal, a horizontal synchronization signal and a clock signal.

The timing controller 120 may be supplied with a driving signal (or a timing signal), which includes the data enable signal DE, or the vertical synchronization signal, the horizontal synchronization signal and a clock signal, and the data signal DATA from the image processing portion 110. The timing controller 120 may output a gate timing control signal GDC to control a driving timing of the gate driver 140, and a data timing control signal DDC to control a driving timing of the data driver 130 based on the timing signal.

In response to the data timing control signal DDC from the timing controller 120, the data driver 130 may sample and latch the data signal DATA from the timing controller 120, then convert the data signal DATA into a corresponding gamma reference voltage, and then output the data signal DATA. The data driver 130 may output the data signals DATA through the corresponding data lines DL1 to DLn.

In response to the gate timing control signal GDC from the timing controller 120, the gate driver 140 may shift a level of a gate voltage and then output a gate signal. The gate driver 140 may output the gate signals through the corresponding gate lines GL1 to GLm.

The display region 150 may display an image with pixels 160 emitting lights according to the data signals DATA supplied from the data driver 130 and the gate signals supplied from the gate driver 140.

A plurality of gate lines GL1 to GLm arranged along a row direction and in parallel with each other on the display region 150 may cross a plurality of data lines DL1 to DLn arranged along a column direction and in parallel with each other on the display region to define a plurality of sub-pixel regions (or a plurality of sub-pixels), and a group of sub-pixels may define the pixel 160.

The group of sub-pixels may mean that at least three, for example, red, green and blue sub-pixels constitute one group to define one pixel.

For the purpose of explanations, the sub-pixel region may be divided into a sub-driving element region where a plurality of transistors and a capacitor are located to drive the pixel, and a sub-emitting element region which includes two electrodes and an emitting layer therebetween to emit a light. Each sub-driving element region and each sub-emitting element region may be separated from each other by an insulating layer and be electrically connected to each other through a contact hole formed in the insulating layer.

A plurality of sub-driving element region may be arranged in a matrix form to form a driving element region. Further, a plurality of sub-emitting element region may be arranged in a matrix form to form an emitting element region.

The plurality of gate lines GL1 to GLm may be connected to the gate driver 140 and be supplied with gate signals from the gate driver 140, and the plurality of data lines DL1 to DLn may be connected to the data driver 130 and be supplied with data signals from the data driver 130.

Figure 2:
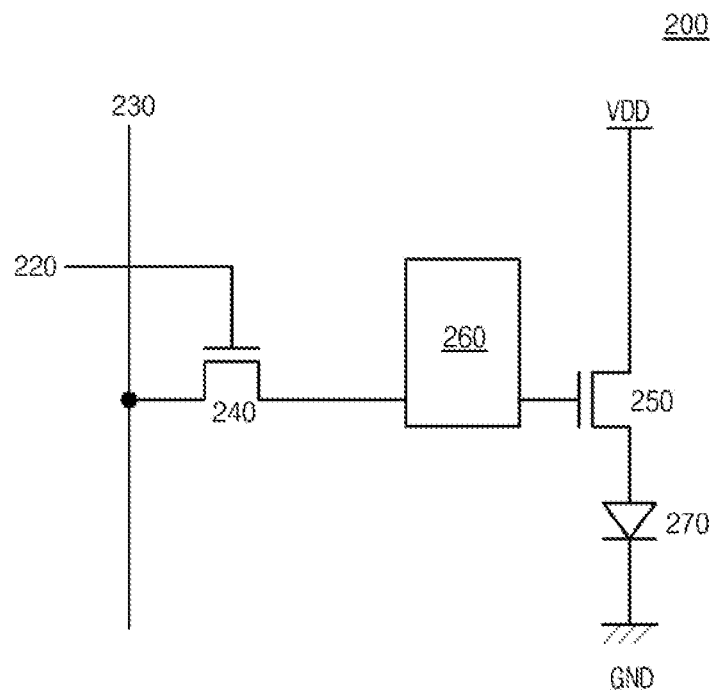
FIG. 2 is a circuit diagram of a pixel included in an electroluminescent display apparatus according to an aspect of the present disclosure.

FIG. 2 is a circuit diagram of one sub-pixel included in an electroluminescent display apparatus according to an aspect of the present disclosure.

Referring to FIG. 2, the sub-pixel of the electroluminescent display apparatus 200 may include a switching transistor 240, a driving transistor 250, a compensation circuit 260 and an emitting element 270.

The emitting element 270 may emit a light by a driving current formed by the driving transistor 250.

The switching transistor 240 may conduct a switching operation corresponding to a gate signal supplied through the gate line 220 so that a data signal supplied through the data line 230 is stored as a data voltage in a capacitor.

The driving transistor 250 may operate corresponding to the data voltage stored in the capacitor so that a constant driving current flows between a high potential power line VDD and a low potential power line GND.

The compensation circuit 260 may be a circuit to compensate for a threshold voltage of the driving transistor 250 and so on. The compensation circuit 260 may include at least one thin film transistor and a capacitor. A configuration of the compensation circuit 260 may be varied depending on compensation methods.

In other words, the sub-pixel of the electroluminescent display apparatus 200 may be usually configured with a 2T(Transistor)1C(Capacitor) structure which includes the switching transistor 240, the driving transistor 250, the capacitor and the emitting element 270. However, in case that the compensation circuit 260 is further added, the sub-pixel of the electroluminescent display apparatus 200 may be configured with various structures of 3T1C, 4T2C, 5T2C, 6T1C, 6T2C, 7T1C, 7T2C and the like.

Figure 3:
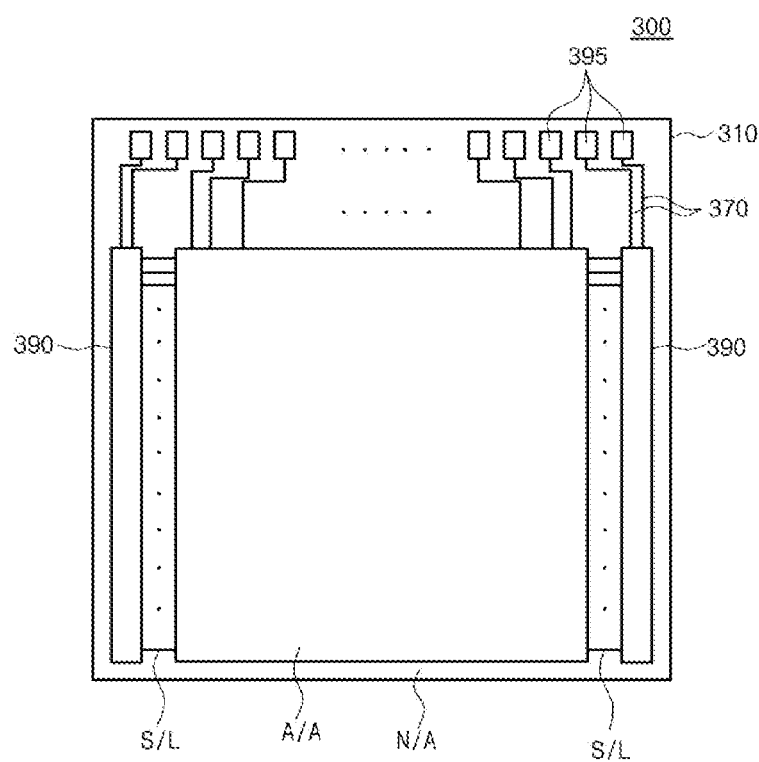
FIG. 3 is a plan view of an electroluminescent display apparatus according to an aspect of the present disclosure.

FIG. 3 is a plan view of an electroluminescent display apparatus according to an aspect of the present disclosure.

In FIG. 3, it is shown that a substrate 310 of the electroluminescent display apparatus 300 is not in a folded or bent state.

Referring to FIG. 3, the electroluminescent display apparatus 300 may include a display area (or active area) A/A on a substrate 310, where pixels to actually emit a light through thin film transistors and emitting elements are arranged, and a non-display area (or non-active area) N/A on the substrate 310 surrounding a boundary of the display area A/A.

In the non-display area N/A, a driving circuit portion to drive the electroluminescent display apparatus 300, such as a gate driving portion 390 and so on, and various signal lines, such as scan lines S/L and so on, may be located. Further, the driving circuit portion to drive the electroluminescent display apparatus 300 may be formed on the substrate 310 in a GIP (Gate In Panel) type, or may be configured in a TCP (Tape Carrier Package) type or COF (Chip On Film) type to be connected to the substrate 310.

Pads 395 may be located at a side of the non-display area N/A of the substrate 310. The pads 395 may be metal patterns which are bonded to an external module.

A prior art electroluminescent display apparatus includes a display area in which a driving element region where driving elements, which may be driving transistors, are arranged in a matrix form, and an emitting element region where sub-emitting elements each including a first electrode, a second electrode corresponding to the first electrode and an emitting layer therebetween are arranged in a matrix form match each other.

However, in the electroluminescent display apparatus 300, the driving element region and the emitting element region may not match each other in a plan view, and the emitting element region may extend beyond the driving element region into the non-display area N/A and may have a greater area than the driving element region.

An electroluminescent display apparatus according to an aspect of the present disclosure is further explained below with reference to FIGS. 4, 5, 6A to 6C and 7.

For the purpose of explanations, the display area A/A of FIG. 3 is divided into a driving element region D/A where a plurality of driving elements configured with driving transistors and so on are arranged in a matrix form, and an emitting element region E/A where emitting elements each including a first electrode which may be an anode, a second electrode which may be a cathode, and an emitting layer therebetween are arranged in a matrix form.

One sub-pixel may be configured to include the driving element and the emitting element, and red, green and blue sub-pixels and further a white sub-pixel may form one unit pixel.

Figure 6A:
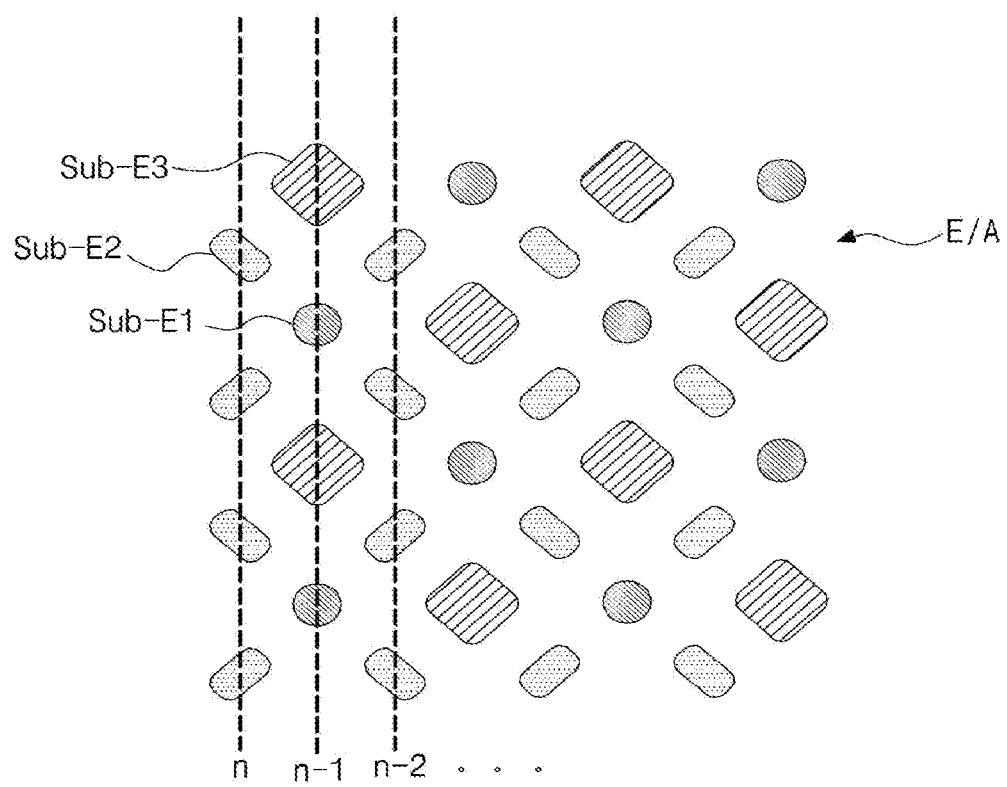
FIG. 6A is a plan view illustrating an emitting element region according to an aspect of the present disclosure.
Figure 6B:
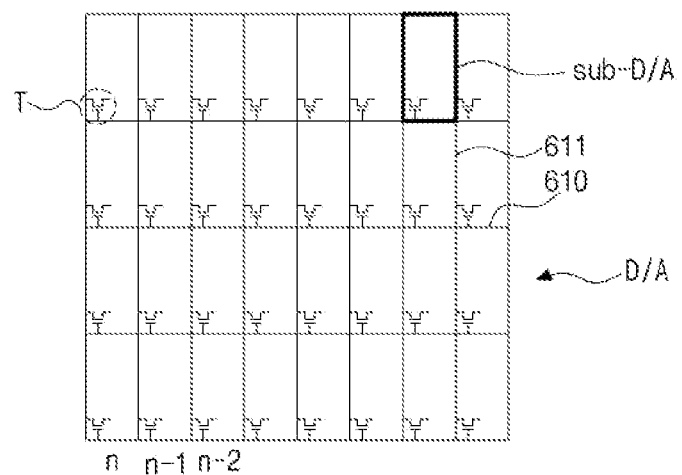
FIG. 6B is a plan view illustrating a driving element region according to an aspect of the present disclosure.

Referring to FIG. 6B, the driving element region D/A may be a region where sub-driving element regions sub-D/A defined by a plurality of gate lines 610 and a plurality of data lines 611 are arranged in a matrix form.

The plurality of gate lines 610 may extend in parallel with each other in a row direction on a substrate SUB. The plurality of data lines 611 may extend in parallel with each other in a column direction on a substrate SUB. The sub-driving element regions sub-D/A may be defined by the crossing of the gate lines 610 and the data lines 611. Accordingly, the sub-driving element region sub-D/A may be a region of a quadrangular shape defined by two neighboring gate lines 610 and two neighboring data lines 611 which cross the two neighboring gate lines 610. However, a shape of the sub-driving element region sub-D/A is not limited to the quadrangular shape.

The sub-driving element regions sub-D/A may be arranged in a matrix form to constitute a driving element region D/A.

In the sub-driving element region sub-D/A, the driving element T such as a driving transistor may be located. In the sub-driving element region sub-D/A, besides the driving transistor, a switching transistor, a capacitor and a compensation transistor may be further added.

The sub-driving element sub-D/A may be usually configured with a 2T1C structure. However, in case that a compensation circuit is further added, the sub-driving element sub-D/A may be configured with various structures of 3T1C, 4T2C, 5T2C, 6T1C, 6T2C, 7T1C, 7T2C and the like.

The emitting element region E/A is explained with reference to FIG. 6A. In FIG. 6A, a structure of emitting elements being arranged in a pentile matrix form is described by way of example, but it is not limited.

The emitting element region E/A may be a region where the red, green and blue sub-emitting element regions sub-E1, sub-E2 and sub-E3 are arranged in a matrix form. Each of the red, green and blue sub-emitting element regions sub-E1, sub-E2 and sub-E3 may one-to-one correspond to and be electrically connected to the sub-driving element sub-D/A, and may be supplied with a driving signal and emit a light.

Each of the red, green and blue sub-emitting element regions sub-E1, sub-E2 and sub-E3 may include two electrodes and an emitting layer therebetween.

In other words, the sub-emitting element region sub-E/A may include a first electrode 709 which may be an anode, a second electrode 711 which may be a cathode, and an emitting layer EL therebetween.

The first electrode 709 may serve as a pixel driving electrode and be formed in each sub-emitting element region sub-E/A. The second electrode 711 may serve as a common electrode and be formed in a single body all over the emitting element region E/A.

The emitting layer EL may be formed in each sub-emitting element region sub-E/A corresponding to the first electrode 709. The emitting layer EL may include functional layers such as a hole transporting layer and an electron transporting layer.

An entire configuration of an electroluminescent display apparatus according to an aspect of the present disclosure is explained with reference to FIGS. 4 and 5.

Figure 4:
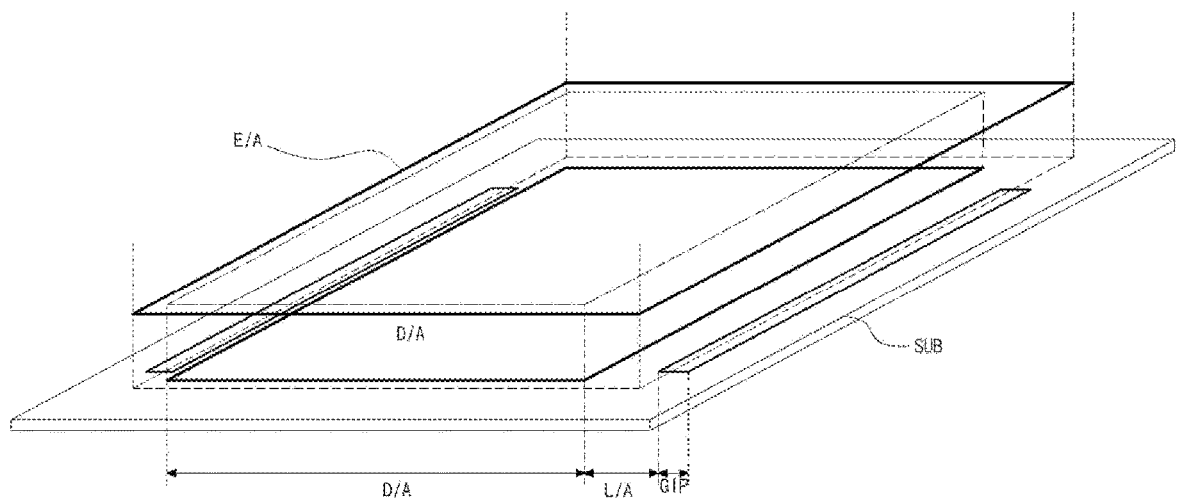
FIG. 4 is a perspective view illustrating an overlapping region of a driving element region and an emitting element region of an electroluminescent display apparatus according to an aspect of the present disclosure
Figure 5:
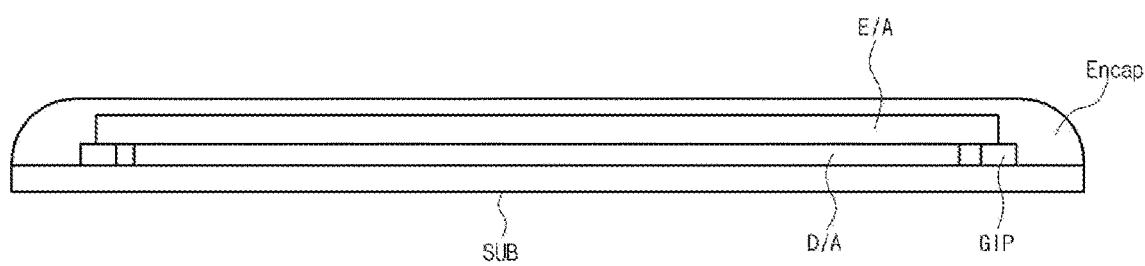
FIG. 5 is a cross-sectional view illustrating positions and scopes of a driving element region and a GIP region out of a peripheral region according to an aspect of the present disclosure.

FIGS. 4 and 5 are a perspective view and a cross-sectional view respectively illustrating a substrate SUB, a driving element region D/A formed on the substrate SUB and an emitting element region E/A formed on the substrate SUB corresponding to the driving element D/A.

The substrate SUB may include a plastic material or glass material. The substrate SUB may include a transparent, opaque or colored polyimide material. For example, the substrate SUB of the polyimide material may be formed by hardening a polyimide resin which is coated on a relatively thick carrier substrate with a release layer interposed therebetween. In this case, the carrier substrate may be removed from the substrate SUB through a laser release process. Because the substrate SUB of the polyimide material separated from the carrier substrate may be very thin, a back plate may be coupled onto a back surface of the substrate SUB. The back plate may keep the substrate SUB in a flat state. The back plate according to an aspect of the present disclosure may include a plastic material, for example, polyethylene terephthalate material.

Alternatively, the substrate SUB may be a flexible glass substrate. For example, the substrate SUB of the glass material may be a thin glass substrate having a thickness of 100 um or less, or an etched carrier glass substrate having a thickness of 100 um or less through a substrate etching process.

On the substrate SUB, a driving element region D/A and a peripheral region surrounding the driving element region D/A may be defined. In the peripheral region, a gate driving circuit portion GIP where gate driving elements respectively connected to gate lines are located, and a link line portion L/A where link lines respectively connecting the gate lines to the gate driving elements are located may be located. Further, a common power line VSS supplying a common power voltage to a common electrode may be located in the peripheral region.

On the driving element region D/A, the emitting element region E/A where the plurality of sub-emitting element region are arranged in a matrix form may be located.

The emitting element region E/A may be located on the driving element region D/A with a planarization layer 708 therebetween. The emitting element region E/A may indicate a region where emitting elements are located when the electroluminescent display apparatus is seen on a plane view thereof, and may indicate am emitting element layer EP when seen from a cross-section referring to FIG. 7. In other words, the driving element region D/A may be formed, then, in order to planarize the driving element region D/A, the substrate SUB may be coated with the planarization layer 708, which is an insulating layer formed of an organic material, to cover the driving element region D/A, and then the emitting element layer EP.

The emitting element region E/A may completely cover the driving element region D/A and further extend into a part of the peripheral region, and specifically, the gate driving circuit portion GIP.

Accordingly, the emitting element region E/A may have an area greater than that of the driving element region D/A, and thus the emitting element region E/A may completely cover the driving element region D/A and further cover the gate driving circuit portion GIP formed in the peripheral region.

In FIGS. 4 and 5, an example of the emitting element region E/A covering the driving element region D/A and extending in a direction to the gate driving circuit portion GIP is shown. However, the emitting element region E/A may extend into other peripheral region.

Figure 6C:
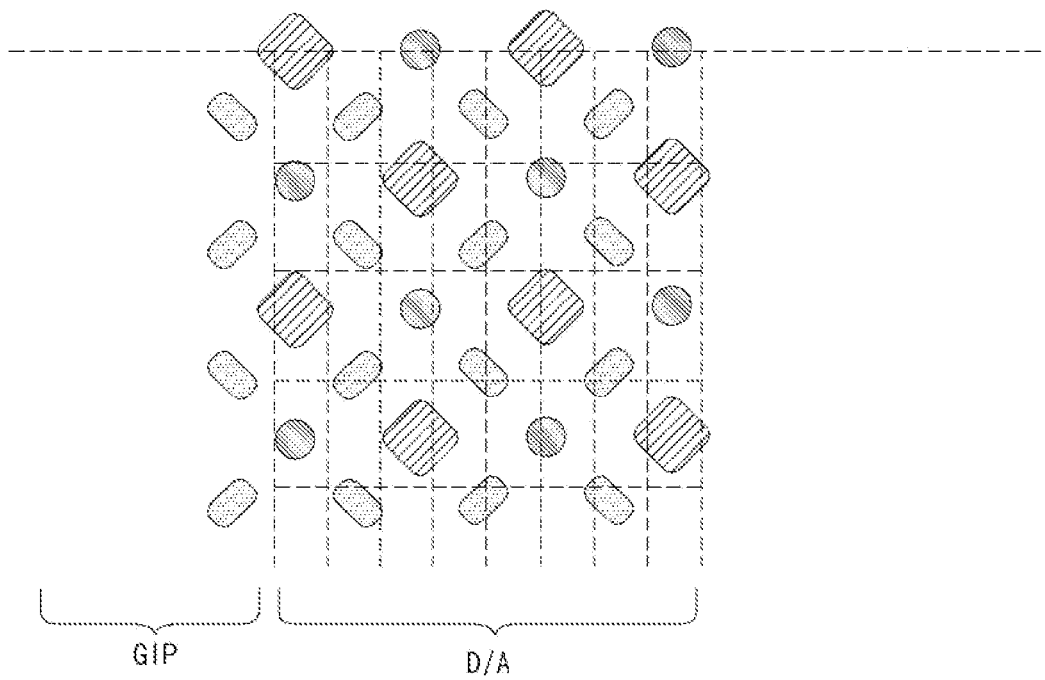
FIG. 6C is a plan view illustrating a concept of an overlapping of an emitting element region and a driving element region according to an aspect of the present disclosure.

Referring to FIG. 6A to 6C, each of the sub-emitting element regions sub-E/A constituting the emitting element region E/A may correspond to each of the sub-driving element regions sub-D/A constituting the driving element region D/A. However, an interval between the sub-emitting element regions sub-E/A constituting the emitting element region E/A may be greater than an interval between the sub-driving element regions sub-D/A constituting the driving element region D/A. Thus, as shown in FIG. 6C, when the emitting element region E/A may overlap the driving element region D/A, the emitting element region E/A may go beyond the driving element region D/A and reach the gate driving circuit portion GIP. Accordingly, when an actual user recognizes the electroluminescent display apparatus, the display area may be seen wider.

A configuration of a cross-section of an electroluminescent display apparatus according to an aspect of the present disclosure is explained with reference to FIG. 7.

A buffer layer 702 may be formed on a top surface of a substrate SUB. The buffer layer 702 may prevent an external moisture or the like from permeating into a driving element layer DP.

The buffer layer 702 may be deposited on a surface of the substrate SUB. The buffer layer 702 may be formed of a plurality of inorganic layers which are stacked alternately. For example, the buffer layer 702 may be formed of multiple layers which are configured with inorganic layers, which include one of silicon oxide (SiOx) layer, silicon nitride (SiNx) layer, and silicon oxynitride (SiON) layer, being stacked alternately. The buffer layer 702 may be omitted as needed.

The driving element layer DP may be a layer in which driving elements forming pixels are formed. The driving element layer DP may include a gate electrode, source and drain electrodes, an active layer and an insulating layer insulating therebetween which are form a thin film transistor.

The driving element region D/A may indicate a region where sub-driving element regions sub-D/A are arranged in a matrix form when the electroluminescent display apparatus is seen on a plane view thereof.

The thin film transistors may be provided in the plurality of sub-driving element regions sub-D/A of the driving element region D/A of the substrate SUB and in the gate driving circuit portion GIP formed in the peripheral region of the substrate SUB.

The thin film transistors TFT-A and TFT-B according to an aspect of the present disclosure may each include an active layer 703, a gate insulating layer 704, a gate electrode 705 on the gate insulating layer 704, an inter-layered insulating layer 706 on the gate electrode 705, and source and drain electrodes 707S and 707D on the inter-layered insulating layer 706. The thin film transistor shown in FIG. 7 may be a driving thin film transistor electrically connected to an emitting element.

Figure 7:
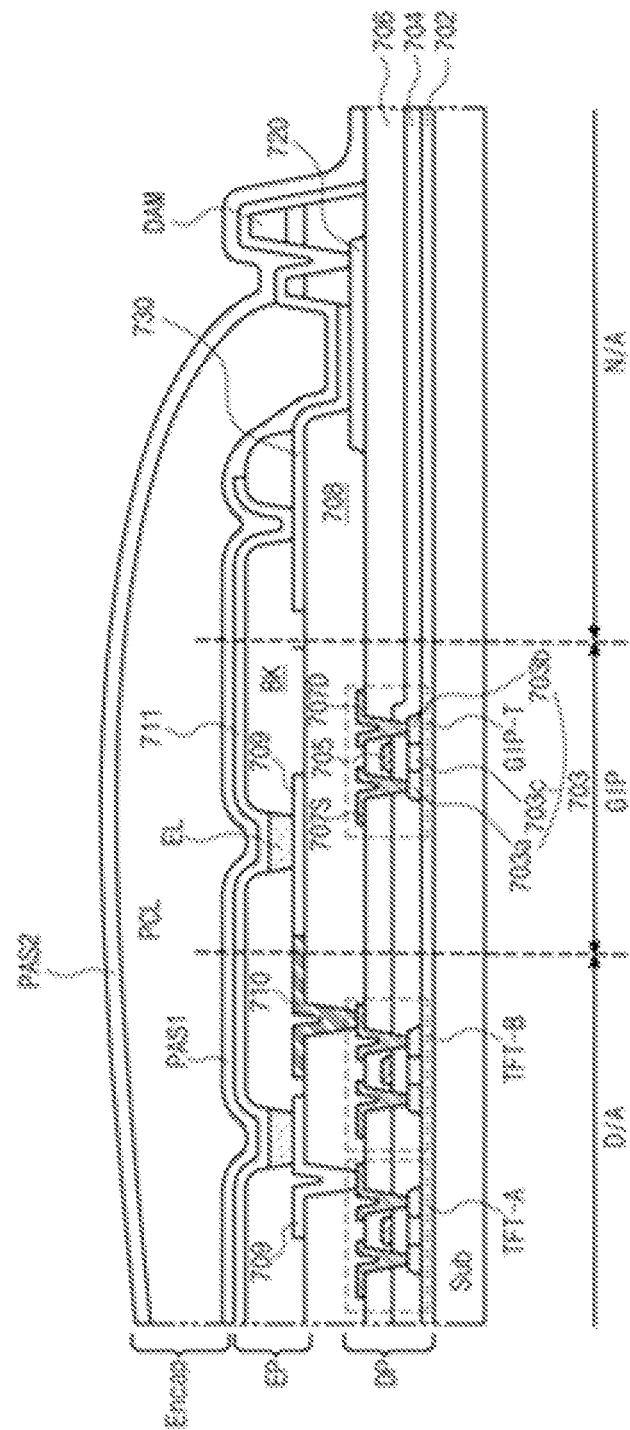
FIG. 7 is a cross-sectional view illustrating an overlapping image of a driving element region and an overlapping element region of an electroluminescent display apparatus according to an aspect of the present disclosure.

It is shown in FIG. 7 that the thin film transistor has a top gate structure of the gate electrode 705 being located on the active layer 703, but it is not limited. As another example, the thin film transistor may have a bottom gate structure of the gate electrode 705 being located below the active layer 703, or a double gate structure of the gate electrode 705 being located on and below the active layer 703.

The active layer 703 may be formed on the substrate SUB or the buffer layer 702. The active layer 703 may be formed of a semiconductor material, for example, a silicon semiconductor material, an oxide semiconductor material or an organic semiconductor material. The active layer 703 may have a single-layered or multi-layered structure. The active layer 703 may include source and drain regions 703a and 703b, which have a semiconductor material doped with impurity ions and are improved in conductivity, and a channel layer 703c which is an intrinsic semiconductor layer formed between the source and drain regions 703a and 703b.

A light-blocking layer (not shown) to block a light incident on the active layer 703 may be added between the substrate SUB and the active layer 703.

The gate insulating layer 704 may be formed entirely over the substrate SUB to cover the active layer 703. For example, the gate insulating layer 704 may be formed of a single-layered or multi-layered inorganic layer using silicon oxide (SiOx) and/or silicon nitride (SiNx).

The gate electrode 705 may be formed on the gate insulating layer 704 to overlap the active layer 703. The gate electrode 705 may be formed along with the gate line 610. The gate electrode 705 of an aspect of the present disclosure may be formed to have a single-layered or multi-layered structure using at least one of molybdenum (Mo), aluminum (Al), chromium (Cr), gold (Au), titanium (Ti), nickel (Ni), neodymium (Nd), copper (Cu) and alloy thereof.

The inter-layered insulating layer 706 may provide a flat surface on the gate insulating layer 704 on the substrate SUB to cover the gate electrode 705 and the gate insulating layer 704.

The source electrode 707S and the drain electrode 707D may be formed on the inter-layered insulating layer 706 to overlap the active layer 703 with the gate electrode 705 located between the source and drain electrodes 707S and 707D and the active layer 703. The source and drain electrodes 707S and 707D may be formed along with the data line 611. Further, a pixel driving power line (VDD) (not shown) supplying a driving voltage to the pixel and a common power line (VSS) (not shown) supplying a common voltage to each pixel may be formed along with the source and drain electrodes 707S and 707D. The source and drain electrodes 707S and 707D, the data line 611, the pixel driving power line (VDD) and the common power line (VSS) may be formed simultaneously when the source and drain electrode material is patterned.

However, the pixel driving power line (VDD) and the common power line (VSS) may be formed at a layer different from the source and drain electrodes 707S and 707D and of a material different from the source and drain electrodes 707S and 707D.

Each of the source and drain electrodes 707S and 707D may be connected to the active layer 703 through a contact hole which penetrates through the inter-layered insulating layer 706 and the gate insulating layer 704.

The source and drain electrodes 707S and 707D may be formed to have a single-layered or multi-layered structure using at least one of molybdenum (Mo), aluminum (Al), chromium (Cr), gold (Au), titanium (Ti), nickel (Ni), neodymium (Nd), copper (Cu) and alloy thereof.

The transistors formed on the substrate SUB may form a driving circuit driving the sub-pixel. A region where the driving circuits are located may be a driving element region. Further, the gate driving circuit portion GIP located at the peripheral region of the substrate SUB may include a thin film transistor equal to or similar to the thin film transistor provided at the sub-pixel.

The planarization layer 708 may be an organic layer which covers the driving element layer DP including the thin film transistors formed on the substrate SUB and planarizes a surface of the driving element layer DP. The planarization layer 708 may entirely cover the driving element region D/A when seen on a plane view. The planarization layer 708 of an aspect of the present disclosure may be formed of an organic layer such as acryl resin, epoxy resin, phenolic resin, polyamide resin, polyimide resin or the like.

The planarization layer 708 may be formed much thicker than a plurality of inorganic thin films forming the driving element layer DP. Thus, the planarization layer 708 may serve to planarize the driving element layer DP and to suppress a parasitic capacitor which may be produced between the driving element layer DP and the emitting element layer EP formed on the driving element layer DP.

The planarization layer 708 may include a contact hole exposing the drain electrode 707D of the thin film transistor provided at the driving element layer DP.

The emitting element layer EP may be located on the planarization layer 708. The emitting element layer EP may mean the emitting element region E/A of FIG. 4 when seen on a plane view. The emitting element layer EP may include the emitting element, a bank layer defining a region where the emitting element is formed, and a plurality of spacers located on the bank layer.

Referring to FIG. 7, the planarization layer 708 may cover the driving element region D/A, the gate driving circuit portion GIP and a part outside the gate driving circuit portion GIP.

The bank layer BK referred to as a pixel defining layer may be located on the planarization layer 708 and define an emitting region of the sub-pixel in the display area A/A.

The emitting element may include a first electrode 709 which is a pixel driving electrode, a second electrode 711 which is a common electrode facing the first electrode, and an emitting layer EL interposed between the first electrode 709 and the second electrode 711.

The emitting element may be formed in the sub-emitting element region and be one-to-one connected to the driving element of the sub-driving element region.

The first electrode 709 may be formed on the planarization layer 708 and be electrically connected to the drain electrode 707D of the driving thin film transistor through the contact hole provided in the planarization layer 708. In this case, the bank layer BK may cover an edge of the first electrode 709, and a center portion of the first electrode 709 may be open due to an open region where the bank layer BK is removed and thus the first electrode 709 is exposed. In other words, the bank layer BK formed of an organic layer may include the open region in which a bank material located directly over the first electrode 709 is removed, and the emitting layer EL may be deposited at the open region and be electrically connected to the first electrode 709. The emitting layer EL may be applied with charges from the first electrode 709 to emit a light.

In a top emission type electroluminescent display apparatus in which an emission direction is directed to a top surface of the substrate, the first electrode 709 may include a metal material of a high reflectance. For example, the first electrode 709 may have a multi-layered structure, such as a stack structure (Ti/Al/Ti) of aluminum (Al) and titanium (Ti), a stack structure (ITO/Al/ITO) of aluminum (Al) and ITO, an APC (Ag/Pd/Cu) alloy stack structure, and a stack structure (ITO/APC/ITO) of APC alloy and ITO, or a single-layered structure formed of one of silver (Ag), aluminum (Al), molybdenum (Mo), gold (Au), magnesium (Mg), calcium (Ca) and barium (Ba), or an alloy of at least two materials thereof.

The emitting layer EL may be deposited at the open region defined by the bank layer BK. In other words, the emitting layer EL may cover the first electrode 709 exposed by the open region and a bank located at side surface of the open region. As the case may be, the emitting layer EL may be deposited on the first electrode 709, a side surface of the bank layer BK near the open region and a part of a top surface of the bank layer BK.

To deposit the emitting layer EL at the open region of the bank layer BK, a fine metal mask (FMM) may be used. In other words, the emitting layer EL of an organic material may be deposited at the open region of the bank by a deposition method, and in order to precisely define a deposition position of the emitting layer EL, the fine metal mask in which a portion corresponding to the open region of the bank layer BK is open may be aligned with the bank layer BK and the emitting organic material may be deposited.

As a process of aligning the fine metal mask (FMM) with the bank layer BK and depositing the emitting layer EL may be a very precise process, the spacer 420 may be formed on the bank layer BK in order to minutely and uniformly separate the fine metal mask (FMM) from the bank layer BK. The spacer 420 may serve to support the fine metal mask (FMM) when aligning the fine metal mask (FMM) on the bank layer BK.

The emitting layer EL of an aspect of the present disclosure may be one of a red emitting portion, a green emitting portion and a blue emitting portion to emit a color light corresponding to a color set at the sub-pixel. The emitting layer EL may include one of an organic emitting layer, an inorganic emitting layer and an quantum dot emitting layer, or include a stack or mixture structure of an organic emitting layer (or an inorganic emitting layer) and a quantum dot emitting layer.

Additionally, the emitting layer EL may further include a functional layer to improve an emitting efficiency and/or a lifetime of the bank layer BK.

The second electrode 711 which may be a common electrode may be formed to be electrically connected to the emitting layer EL. The second electrode 711 may cover an entire emitting element region E/A on the substrate SUB to be connected in common to the emitting layer EL provided in each sub-pixel.

The second electrode 711 of an aspect of the present disclosure may include a transparent conductive material or semi-transparent conductive material which can transmit a light. In the case that the second electrode 711 may be formed of a semi-transparent conductive material, an output efficiency of a light emitted from the emitting element may increase due to a micro cavity structure. The semi-transparent conductive material of an aspect of the present disclosure may include magnesium (Mg), silver (Ag), an alloy of magnesium (Mg) and silver (Ag), or the like. Additionally, a capping layer may be formed on the second electrode 711 and may serve to adjust a refractive index of a light emitted from the emitting element and to improve a light output efficiency.

An aspect of the present disclosure referring to FIGS. 6A to 6C may explain that the sub-driving element regions sub-D/A are distributed at equal distances and the sub-emitting element regions sub-E/A are distributed at equal distances. (However, it is not limited but a technical idea of the present disclosure may be realized with various aspects.)

Assuming that an outermost column of driving elements formed in the driving element region D/A is a nth column, a column next to the nth column is a (n−1)th column and a column next to the (n−1)th column is a (n−2)th column, and an outermost column of sub-emitting element regions formed in the emitting element region E/A is a nth column, a column next to the nth column is a (n−1)th column and a column next to the (n−1)th column is a (n−2)th column, each column of the driving element region D/A may correspond to each column of the emitting element region E/A. However, in an aspect of the present disclosure, because a total area of the emitting element region E/A is greater than a total area of the driving element region D/A, the sub-emitting element region sub-E/A of the emitting element region E/A may not completely overlap the sub-driving element region sub-D/A of the driving element region D/A. Accordingly, the electroluminescent display apparatus of an aspect of the present disclosure may further include a first connection electrode 710 electrically connecting the sub-driving element region sub-D/A to the sub-emitting element region sub-E/A. Specifically, the first connection electrode 710 may connect a drain electrode of a driving thin film transistor formed in the sub-driving element region sub-D/A to a pixel driving electrode of an emitting element formed in the sub-emitting element region sub-E/A.

The first connection electrode 710 may not be needed when the sub-driving element region sub-D/A may completely overlap the sub-emitting element region sub-E/A. In other words, when one electrode of the driving transistor or compensation transistor formed in the sub-driving element region sub-D/A overlaps the first electrode of the emitting element, these two electrodes may be directly connected by forming a contact hole through the planarization layer and the inter-layered insulating layer. However, when the sub-driving element region sub-D/A and the sub-emitting element region sub-E/A do not overlap on a plane view, the first connection electrode 710 may be needed. In other words, as one electrode of the driving transistor or compensation transistor formed in the sub-driving element region sub-D/A may not overlap the first electrode of the emitting element on a plane view, these two electrodes may be connected through the first connection electrode 710.

Referring to FIG. 7, an emitting element of the outermost column (i.e., the nth column) of the emitting element region E/A may be located on the gate driving circuit portion GIP. Thus, the driving transistor TFT-B of the outermost column (i.e., the nth column) of the driving element region D/A may not overlap the emitting element of the outermost column (i.e., the nth column) of the emitting element region E/A, and the driving transistor TFT-B may be connected to the emitting element. As a result, when a user recognizes a display apparatus, the user can recognize that a bezel region is narrower and a display area is wider.

The driving element and emitting element located at the outermost pixel column of the driving element region D/A and the emitting element region E/A is explained as an example, but the present disclosure is not limited thereto. In other words, a plurality of emitting elements belonging to a plurality of pixel columns located at an edge of the driving element region may be arranged at a peripheral region and be connected to a driving element in the driving element region D/A by the first connection electrode 710, and thus an effect of broadening a display area may be obtained.

To explain an example of a display apparatus for a mobile device, when a width of the display apparatus is 600 mm~650 mm and a width of the gate driving circuit portion GIP located at the peripheral region is about 500 um~900 um, a width of one sub-pixel may be 20 um~50 um. Accordingly, about 10~45 columns of sub-emitting element regions may be arranged on the gate driving circuit portion GIP. As more emitting elements are arranged at the gate driving circuit portion GIP, a display area can be wide and a bezel can be narrow.

The first connection electrode 710 may be formed of the same material as the first electrode 709. Further, it is possible that the first connection electrode 710 is formed simultaneously with the first electrode 709 in the same one process. Accordingly, the first electrode 710 may be formed on the planarization layer 708.

The first connection electrode 710 may be formed over the driving element region D/A and the gate driving circuit portion GIP. In other words, because the first connection electrode 710 connects one electrode of the driving element formed at an outermost part of the driving element region D/A to the first electrode formed at the sub-emitting element region sub-E/A located on the gate driving circuit portion GIP, the first connection electrode 710 may be located to traverse the driving element region D/A and the gate driving circuit portion GIP.

In another aspect, the first connection electrode 710 may be formed of a separate line formed between the planarization layer 708 and the inter-layered insulating layer 706. In other words, after a second inter-layered insulating layer (not shown) is formed on the inter-layered insulating layer 706, the first connection electrode 710 may be formed on the second inter-layered insulating layer. The first connection electrode 710 formed on the second inter-layered insulating layer may connect the first electrode of the emitting element to one electrode of the driving element through a contact hole.

Referring to FIG. 6, in an aspect of the present disclosure, a case of the electroluminescent display apparatus in which the sub-driving element regions sub-D/A and the sub-emitting element regions sub-E/A are arranged uniformly and one-to-one correspond to each other is explained, but it is not limited.

For example, when a width of the sub-driving element region sub-D/A at an edge portion of the driving element region D/A among the sub-driving element regions sub-D/A of the driving element region D/A is formed to be narrower than that of other region of the display area and an interval between the sub-emitting element regions located in the emitting element region E/A is maintained constant, a part of the sub-emitting element region may be located in the gate driving circuit portion GIP.

Referring to FIG. 7, the emitting element layer EP may be sealed by an encapsulation layer Encap.

The encapsulation layer Encap may be formed by sequentially stacking a first inorganic encapsulation layer PAS1, a first organic encapsulation layer PCL and a second inorganic encapsulation layer PAS2.

Because the encapsulation layer Encap is deposited on the emitting element layer EP, the first inorganic encapsulation layer PAS1 may be deposited to contact the second electrode 711.

Usually, the first inorganic encapsulation layer PAS1 may be deposited by a chemical vapor deposition method. However, the first inorganic encapsulation layer PAS1 may be deposited by an atomic layer deposition method.

The first inorganic encapsulation layer PAS1 and the second inorganic encapsulation layer PAS2 may be formed to extend up to ends of the substrate.

A dam DAM serving to prevent a spread of the organic encapsulation layer PCL may be formed at an edge of the substrate SUB. The dam DAM may overlap at least one of the planarization layer, the bank layer and the spacer layer and surround the display area at the edge of the substrate.

Further, referring to FIG. 7, the common power line (VSS) 720, which may be formed simultaneously with the source and drain electrodes, may be formed on the inter-layered insulating layer 706 in the non-display area. The common power line (VSS) 720 may be a line applying a common voltage to the second electrode 711 and may be connected to the second electrode 711 through a common electrode connection line 730 which may be formed at the same time as the first electrode 709 and of the same material as the first electrode 709.

A cover glass may be located on the encapsulation layer Encap and be coupled to the encapsulating layer Encap through an adhesive or the like, and thus the display panel may be completed.

Figure 8:
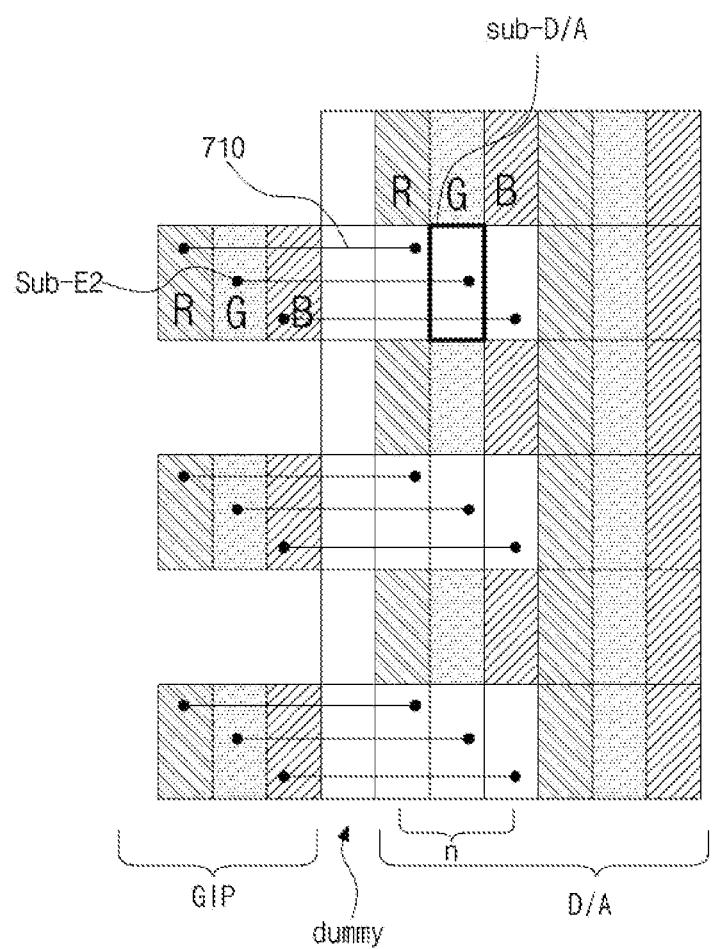
FIG. 8 is a plan view illustrating an emitting element region being located at a boundary between a driving element region and a peripheral region of an electroluminescent display apparatus according to another aspect of the present disclosure.

An electroluminescent display apparatus according to another aspect of the present disclosure is explained with reference to FIG. 8. In FIG. 8, an electroluminescent display apparatus in which sub-pixels of the same color are arranged in the same column is shown by way of example.

In another aspect of the present disclosure referring to FIG. 8, the driving element region D/A may have the same configuration as in the above first aspect. However, a sub-emitting element region out of the emitting element region E/A corresponding to one pixel column of an outermost sub-driving element region i.e., a sub-driving element region on a nth column, of the driving element region D/A may be located alternately by pixel at the driving element region D/A and the gate driving circuit portion GIP. Accordingly, the display area may go beyond the driving element region D/A and extend into the gate driving circuit portion GIP which is a non-display area in the prior art.

The sub-emitting element region sub-E/A located on the gate driving circuit portion GIP may be connected to the sub-driving element region sub-D/A by the first connection electrode 710. A manner of the connection may be the same as that of the above first aspect.

In another aspect of the present disclosure referring to FIG. 8, a dummy pixel region may be further provided between the driving element region D/A and the gate driving circuit portion GIP, but it is not limited.

In another aspect of the present disclosure referring to FIG. 8, the display apparatus may have multiple resolutions, which means densities of pixels per located unit area are different in the display apparatus. In other words, referring to FIG. 8, a resolution of a nth pixel column may be a half of a resolution of a (n−1)th pixel column In another aspect of the present disclosure referring to FIG. 8, a case that pixels belonging to one pixel column located at an outermost part of the driving element region D/A are located alternately by pixel at the driving element region D/A and the gate driving circuit portion GIP is shown, but it is not limited. In other words, a plurality of pixel columns located at an edge portion of the driving element region D/A may be arranged in the same form by every pixel column.

An electroluminescent display apparatus according to another aspect of the present disclosure is explained with reference to FIG. 9.

Figure 9:
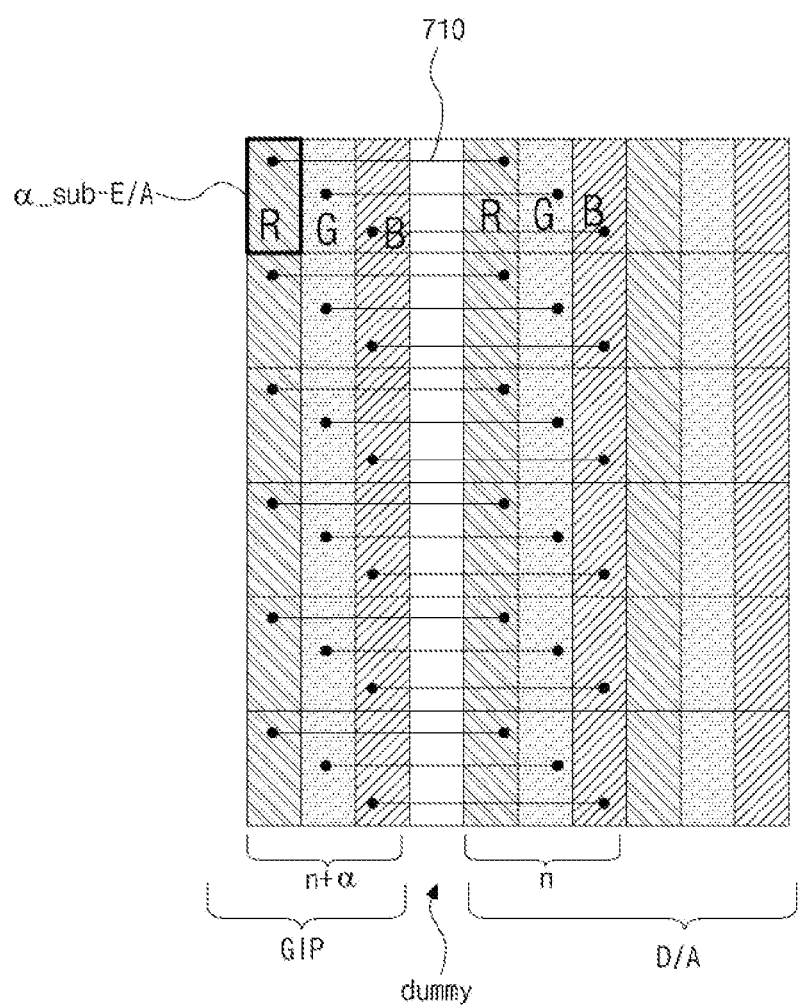
FIG. 9 is a plan view illustrating an emitting element region being located at a boundary between a driving element region and a peripheral region of an electroluminescent display apparatus according to another aspect of the present disclosure.

In another aspect of the present disclosure referring to FIG. 9, besides of a sub-emitting element region sub-E/A one-to-one corresponding to a sub-driving element region sub-D/A of the driving element region D/A, an additional sub-emitting element may be further provided. In other words, while sub-driving elements and sub-emitting elements constituting the display area have the same number in the above aspect, a number of emitting elements constituting the emitting element region E/A may be greater in this another aspect. The additional emitting elements may constitute one pixel column and be located on the gate driving circuit portion GIP.

Referring to FIG. 9, a region where the additional emitting elements are formed may be referred to as an additional emitting element region α-sub-E/A.

The additional emitting element region α-sub-E/A may be connected to the sub-driving element region sub-D/A of the driving element region D/A through the first connection electrode 710. In the aspect of the present disclosure described in FIG. 9, the additional emitting element region α-sub-E/A may be connected to the sub-driving element region sub-D/A located at an outermost part of the driving element region D/A. Accordingly, the sub-driving element region sub-D/A of the nth column pixel located at an outermost part of the driving element region D/A may correspond to and be connected to two sub-emitting element regions on a nth column and a (n+α)th column.

Regarding the additional emitting element regions α-sub-E/A, in order that one pixel may be completely formed by the additional emitting element regions, a plurality of sub-emitting element regions may be added. For example, when red, green and blue sub-pixels are needed to constitute one pixel and each sub-pixel may include a sub-emitting element region, at least 3 sub-emitting element regions may be added such that red, green and blue sub-emitting element regions may constitute one pixel.

Figure 10:
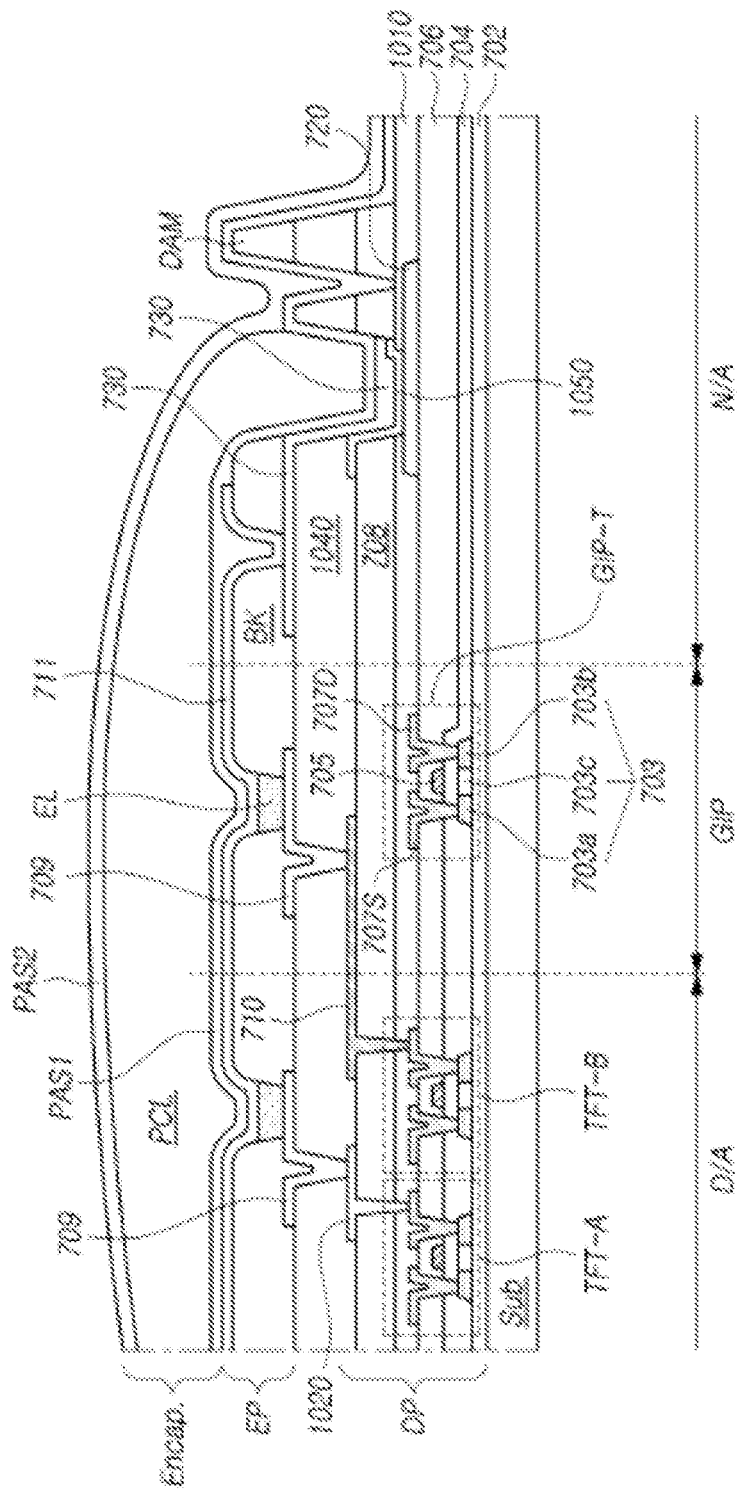
FIG. 10 is a cross-sectional view illustrating an overlapping image of a driving element region and an overlapping element region of an electroluminescent display apparatus according to another aspect of the present disclosure.

An electroluminescent display apparatus according to another aspect of the present disclosure is explained with reference to FIG. 10. The another aspect referring to FIG. 10 is very similar to the aspect referring to FIG. 7 but may have an idea of forming a separate insulating layer to form the first connection electrode 710. Explanations of the same or like parts of the aspect referring to FIG. 7 may be omitted.

In another aspect referring to FIG. 10, the first connection electrode 710 may be formed on the planarization layer 708, then a second planarization layer 1040 may be formed on the first electrode 710 and the planarization layer 708, and then the emitting element layer EP may be formed.

Referring to FIG. 10, the source electrode 707S and the drain electrode 707D as parts of the thin film transistor may be formed on the inter-layered insulating layer 706 of the driving element region D/A and the gate driving circuit portion GIP, and the common power line 720 may be formed on the inter-layered insulating layer 706 of the non-display region N/A. The source electrode 707S, the drain electrode 707D and the common power line 720 may be formed of the same material using one mask process.

A second inter-layered insulating layer 1010 of an inorganic layer may be formed on the inter-layered insulating layer 706. The second inter-layered insulating layer 1010 may serve to insulate the source electrode 707S and the drain electrode 707D and serve as a protection layer.

The planarization layer 708 as an organic layer may be formed on the second inter-layered insulating layer 1010. The planarization layer 708 may be formed of an organic layer such as acryl resin, epoxy resin, phenolic resin, polyamide resin, polyimide resin or the like.

The first connection electrode 710 may be formed on the planarization layer 708. Along with the first connection electrode 710, a second connection electrode 1020 and a second common power line 1050 may be further formed on the planarization layer 708. The first connection electrode 710 may connect the driving transistor TFT-B located at an edge of the driving element region D/A to the first electrode 709 as an anode located at a top portion of the gate driving circuit portion GIP. The second connection electrode 1020 may connect the driving transistor TFT-A, which is located at a portion of the driving element region D/A different from an edge of the driving element region D/A, to the first electrode 709 as an anode located at a top portion of the driving element region D/A.

The second common power line 1050 may be connected to the common power line 720 which is located on the inter-layered insulating layer 706 of the non-display region N/A. Thus, the second inter-layered insulating layer 1010 and the planarization layer 708 which are deposited on the common power line 720 located at the non-display region N/A may be removed to form an open portion.

The second planarization layer 1040 may be further formed on the planarization layer 708. The second planarization layer 1040 may be formed of the same material as the planarization layer 708 to entirely cover the substrate.

The emitting element layer EP, which is explained in the aspect referring to FIG. 7, may be formed on the second planarization layer 1040. The first electrode 709, which is a part of the sub-emitting element located at the gate driving circuit portion GIP, and the first connection electrode 710 may be connected to each other through a contact hole. A configuration of the emitting element layer EP formed on the second planarization layer 1040 may be equal to that of the aspect referring to FIG. 7, and thus explanation thereof may be omitted.

In another aspect referring to FIG. 10, the driving element layer DP and the emitting element layer EP may be insulated from each other by two planarization layers. When the planarization layer 708 is formed then the first connection line 710 is formed on the planarization layer 708 and the first electrode 709 is formed on the second planarization layer 1040, various lines made of a material of the first electrode 709, for example, the common electrode connection line 730 connecting the common power line (VSS) to the second electrode 711 as a cathode, and the first connection line 710 may be formed at different layers, and thus a short-circuit can be solved fundamentally.

Further, various lines applying signals from the gate driving circuit portion GIP to the driving element region D/A may be designed to be dispersed on the planarization layer 708 and the second planarization layer 1040, and thus a degree of freedom in design can increase.

According to the above aspects of the present disclosure, using a feature of a display apparatus of a driving element region being divided from an emitting element region, an emitting element region may extend to a peripheral region surrounding a driving element, and particularly, extent to a GIP region where a gate driving circuit portion is located, and thus there is an advantage that a width of a bezel of an electroluminescent display apparatus can be further reduced.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A light emitting diode display apparatus, comprising:
a substrate;
a driving element region which is formed on the substrate and in which a plurality of driving elements are arranged in a matrix form; and
an emitting element region in which a plurality of emitting elements are arranged in a matrix form, wherein each emitting element of the plurality of emitting elements includes a first electrode that is electrically connected to a corresponding driving element of the plurality of driving elements, a second electrode corresponding to the first electrode, and an emitting layer located between the first electrode and the second electrode,
wherein an area of the emitting element region is greater than an area of the driving element region, and
wherein a number of the plurality of emitting elements included in the emitting element region is great than a number of the plurality of driving elements included in the driving element region.

2. The light emitting diode display apparatus of claim 1, wherein the driving element region completely overlaps with the emitting element region.

3. The light emitting diode display apparatus of claim 1, wherein the driving element region includes a plurality of sub-driving element regions which are defined by a plurality of gate lines and a plurality of data lines crossing each other, and
wherein each driving element of the plurality of driving elements is located at a corresponding sub-driving element region of the plurality of sub-driving element regions.

4. The light emitting diode display apparatus of claim 2, wherein a peripheral region surrounding the driving element region includes a driving circuit portion which supplies a driving signal to the driving element, and
wherein the emitting element region overlaps with the driving circuit portion.

5. The light emitting diode display apparatus of claim 1, wherein the emitting element not overlapping with the driving element region is connected to the driving element of the driving element region by a first connection electrode.

6. The light emitting diode display apparatus of claim 5, wherein the first connection electrode is formed of a same material as the first electrode and at a same layer as the first electrode.

7. The light emitting diode display apparatus of claim 1, wherein the driving element located at an outermost part of the driving element region does not overlap with the emitting element located at an outermost part of the emitting element region.

8. The light emitting diode display apparatus of claim 5, further comprising an insulating layer interposed between the driving element region and the emitting element region, wherein the first connection electrode is located on or below the insulating layer and electrically connects the driving element to the emitting element.

9. The light emitting diode display apparatus of claim 8, wherein one side of the first connection electrode is connected to the first electrode, and another side of the first connection electrode is connected to one electrode of the driving element.

10. The light emitting diode display apparatus of claim 1, wherein the number of the plurality of emitting elements included in the emitting element region is m+n and the number of the plurality of driving elements included in the driving element region is m,
wherein n emitting elements form an additional emitting element region and does not overlap with the driving element region, and
wherein each of the n emitting elements forming the additional emitting element region are electrically connected to the driving element of the driving element region.

11. The light emitting diode display apparatus of claim 10, wherein the driving element connected to each emitting element included in the additional emitting element region is further connected to each corresponding emitting element.

12. The light emitting diode display apparatus of claim 1, wherein the light emitting diode display apparatus includes an organic electroluminescent display apparatus or an inorganic electroluminescent display apparatus.

13. The light emitting diode display apparatus of claim 3, wherein a width of the sub-driving element region is narrower at an edge portion of the driving element region than at a center portion of the driving element region.

14. A light emitting diode display apparatus, comprising:
a substrate including a driving element region, in which a plurality of driving elements are arranged in a matrix form, and a peripheral region surrounding the driving element region,
wherein a plurality of emitting elements are arranged in a matrix form in an emitting element region,
wherein each emitting element of the plurality of emitting elements includes a first electrode that is electrically connected to a corresponding driving element of the plurality of driving elements, a second electrode corresponding to the first electrode, and an emitting layer located between the first electrode and the second electrode, and
wherein the emitting element region overlaps with the driving element region and the peripheral region, and
wherein a number of the plurality of emitting elements included in the emitting element region is greater than a number of the plurality of driving elements included in the driving element region.

15. The light emitting diode display apparatus of claim 14, wherein the driving element region completely overlaps with the emitting element region.

16. The light emitting diode display apparatus of claim 14, wherein the driving element region includes a plurality of sub-driving element regions which are defined by a plurality of gate lines and a plurality of data lines crossing each other, and
wherein each driving element of the plurality of driving elements is located at a corresponding sub-driving element region of the plurality of sub-driving element regions.

17. The light emitting diode display apparatus of claim 15, wherein the peripheral region includes a driving circuit portion which supplies a driving signal to the driving element, and
   wherein the emitting element region overlaps with the driving circuit portion.

18. The light emitting diode display apparatus of claim 14, wherein the emitting element not overlapping with the driving element region is connected to the driving element of the driving element region by a first connection electrode.

19. The light emitting diode display apparatus of claim 14, wherein the emitting element overlapping the peripheral region is connected to the driving element of the driving element region by a first connection electrode.

20. The light emitting diode display apparatus of claim 18, wherein the first connection electrode is formed of a same material as the first electrode and at a same layer as the first electrode.

21. The light emitting diode display apparatus of claim 14, wherein the driving element located at an outermost part of the driving element region does not overlap with the emitting element located at an outermost part of the emitting element region.

22. The light emitting diode display apparatus of claim 19, wherein the first connection electrode is located to traverse the driving element region and the peripheral region.

23. The light emitting diode display apparatus of claim 18, further comprising an insulating layer interposed between the driving element region and the emitting element region,
   wherein the first connection electrode is located on or below the insulating layer and electrically connects the driving element to the emitting element.

24. The light emitting diode display apparatus of claim 23, wherein one side of the first connection electrode is connected to the first electrode, and another side of the first connection electrode is connected to one electrode of the driving element.

25. The light emitting diode display apparatus of claim 14, wherein the number of the plurality of emitting elements included in the emitting element region is m+n and the number of the plurality of driving elements included in the driving element region is m,
   wherein n emitting elements form an additional emitting element region and does not overlap with the driving element region, and
   wherein each of the emitting elements forming the additional emitting element region is electrically connected to the driving element of the driving element region.

26. The light emitting diode display apparatus of claim 25, wherein the driving element connected to each emitting element included in the additional emitting element region is further connected to each corresponding emitting element.

27. The light emitting diode display apparatus of claim 14, wherein the light emitting diode display apparatus includes an organic electroluminescent display apparatus or an inorganic electroluminescent display apparatus.

28. The light emitting diode display apparatus of claim 16, wherein a width of the sub-driving element region is narrower at an edge portion of the driving element region than at a center portion of the driving element region.

29. The light emitting diode display apparatus of claim 8, wherein the insulating layer includes a plurality of planarization layers which are each formed of an organic layer, and the first connection electrode and the first electrode are located on different ones of the plurality of planarization layers.

30. The light emitting diode display apparatus of claim 23, wherein the insulating layer includes a plurality of planarization layers which are each formed of an organic layer, and the first connection electrode and the first electrode are located on different ones of the plurality of planarization layers.

* * * * *